United States Patent
Lee et al.

(10) Patent No.: US 9,893,245 B2
(45) Date of Patent: Feb. 13, 2018

(54) COLOR-CONVERTING SUBSTRATE FOR LIGHT-EMITTING DIODE AND METHOD FOR PRODUCING SAME

(71) Applicant: Corning Precision Materials Co., Ltd., Chungcheongnam-do (KR)

(72) Inventors: Ki Yeon Lee, Chungcheongnam-do (KR); Hyung Soo Moon, Chungcheongnam-do (KR); Yoon Seuk Oh, Chungcheongnam-do (KR); Jhee Mann Kim, Chungcheongnam-do (KR); Choon Bong Yang, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/301,147

(22) PCT Filed: Mar. 17, 2015

(86) PCT No.: PCT/KR2015/002543
§ 371 (c)(1),
(2) Date: Sep. 30, 2016

(87) PCT Pub. No.: WO2015/152535
PCT Pub. Date: Oct. 8, 2015

(65) Prior Publication Data
US 2017/0025584 A1    Jan. 26, 2017

(30) Foreign Application Priority Data
Apr. 1, 2014    (KR) .................. 10-2014-0038458

(51) Int. Cl.
*H01L 33/50* (2010.01)
*G02F 1/1335* (2006.01)
(Continued)

(52) U.S. Cl.
CPC .......... *H01L 33/502* (2013.01); *G02F 1/1339* (2013.01); *G02F 1/133621* (2013.01);
(Continued)

(58) Field of Classification Search
CPC combination set(s) only.
See application file for complete search history.

(56) References Cited

U.S. PATENT DOCUMENTS 8,451,402 B2    5/2013  Oshima et al.
2010/0051898 A1    3/2010  Kim et al.
(Continued)

FOREIGN PATENT DOCUMENTS

JP    2010225373 A    10/2010
KR    20100027892 A    3/2010
(Continued)

OTHER PUBLICATIONS

International Search Report for Application No. PCT/KR2015/002543 dated Jul. 6, 2015.

*Primary Examiner* — Jay C Chang
*Assistant Examiner* — Mikka Liu
(74) *Attorney, Agent, or Firm* — Lerner, David, Littenberg, Krumholz & Mentlik, LLP

(57) ABSTRACT

The present invention relates to a color-converting substrate of a light-emitting diode and a method for producing same, and more specifically to a color-converting substrate of a light-emitting diode capable of completely protecting the quantum dots (QD) supported in the interior from the exterior as hermetic sealing is possible, and a method for producing the color-converting substrate. To that end, provided are a color-conversion substrate of a light-emitting diode and a method for producing the color-conversion substrate, the color-conversion substrate of a light-emitting diode comprising: a first substrate and a second substrate
(Continued)

arranged facing each other on a light-emitting diode; a sheet, having a hole, arranged in between the first and second substrates; QDs filling the hole; and sealing material disposed in between the first substrate and the lower surface of the sheet and in between the second substrate the upper surface of the sheet, wherein the sealing material is disposed along the edge of the hole, and the sheet is made of a substance allowing laser sealing of the sealing material, first substrate and second substrate.

3 Claims, 5 Drawing Sheets

(51) Int. Cl.
| | | |
|---|---|---|
| | G02F 1/1339 | (2006.01) |
| | H01L 33/56 | (2010.01) |
| | C09K 11/08 | (2006.01) |
| | G02F 1/1333 | (2006.01) |

(52) U.S. Cl.
CPC .......... H01L 33/505 (2013.01); H01L 33/56 (2013.01); C09K 11/08 (2013.01); *G02F 2001/133354* (2013.01); *G02F 2001/133614* (2013.01); *G02F 2202/36* (2013.01); *G02F 2203/05* (2013.01); *H01L 33/508* (2013.01); *H01L 2933/005* (2013.01); *H01L 2933/0041* (2013.01); *H01L 2933/0083* (2013.01)

(56) References Cited

U.S. PATENT DOCUMENTS

| | | |
|---|---|---|
| 2012/0156436 A1 | 6/2012 | Kim et al. |
| 2013/0223922 A1* | 8/2013 | Koval .................. C03B 23/245 |
| | | 403/270 |

FOREIGN PATENT DOCUMENTS

| | | |
|---|---|---|
| KR | 20100089606 A | 8/2010 |
| KR | 20120050286 A | 5/2012 |
| KR | 20120067167 A | 6/2012 |

* cited by examiner

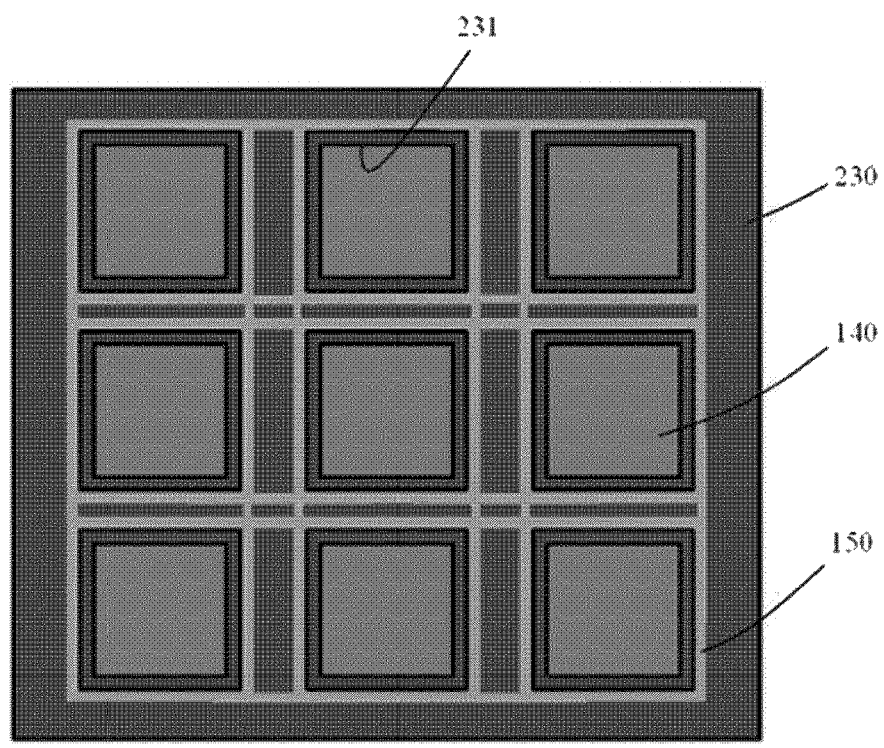

COLOR-CONVERTING SUBSTRATE FOR LIGHT-EMITTING DIODE AND METHOD FOR PRODUCING SAME

CROSS-REFERENCE TO RELATED APPLICATION

This application is a national phase entry under 35 U.S.C. § 371 of International Application No. PCT/KR2015/002543, filed Mar. 17, 2015, published in Korean, which claims priority to Korean Patent Application No. 10-2014-0038458, filed on Apr. 1, 2014, the disclosures of which are incorporated herein by reference.

TECHNICAL FIELD

The present disclosure relates to a color-converting substrate for a light-emitting diode (LED) and a method of producing the same. More specifically, the present disclosure relates to a color-converting substrate for an LED, the color-converting substrate being able to be hermetically sealed to entirely protect quantum dots (QDs) accommodated therein from the outside, and a method of producing the same.

BACKGROUND ART

A light-emitting diode (LED) is a semiconductor device emitting light in response to a current flowing through a compound, such as gallium arsenide. The LED uses a p-n junction structure of a semiconductor into which minority carriers, such as holes or electrons, are injected and emits light through the recombination of the electrons and holes.

The LED has characteristics, such as low power consumption, a relatively long lifespan, ability to be disposed in a narrow space, and strong vibration resistance. In addition, such an LED has been used in a display device and in a backlight unit thereof. Recently, research into applying LEDs to common lighting devices has been conducted. In addition to single color component LEDs, such as red, blue, and green LEDs, white LEDs have been released onto the market. In particular, as white LEDs are applied to products for vehicle lighting devices and general lighting devices, it is expected that demand for the white LEDs will increase sharply.

In LED technology, there are two main methods of realizing white light. The first method is to produce white light by disposing red, green, and blue LEDs to be adjacent to one another and allowing light emitted by the red, green, and blue LEDs to be mixed. However, since the red, green, and blue LEDs have different thermal and temporal characteristics, the ability to mix colors of light uniformly is limited due to changes in tone according to the environment of use and, in particular, the color stains. The second method is to produce white light by disposing a fluorescent material on an LED to allow portions of primary light beams emitted by the LED to be mixed with secondary light beams wavelength-converted by the fluorescent material. For example, a fluorescent material generating yellowish-green or yellow light may be disposed as a light excitation source on a blue LED, whereby white light can be produced by mixing blue light emitted by the blue LED and yellowish-green or yellow excitation light from the fluorescent material. As present, the method of producing white light using a blue LED and a fluorescent material as described above is commonly used.

Recently, quantum dots (QD), able to emit strong light in a narrower wavelength range, as compared to common fluorescent materials, have been used as a material for producing white light. Generally, a QD-LED backlight unit generates white light by irradiating yellow QDs with blue light emitted by a blue LED and uses the generated white light as backlight in a liquid crystal display (LCD) device. A liquid crystal display (LCD) device using such a QD-LED backlight unit has superior color reproducibility, unlike backlight units only using existing LEDs. The liquid crystal display device is able to produce natural color, comparable to natural color generated by an organic light-emitting device (OLED), while manufacturing costs thereof are lower than those of OLED TVs and productivity thereof is high. Accordingly, LCD devices using a QD-LED backlight unit have potential as new displays.

A conventional method of fabricating a QD-LED includes: mixing QDs with a polymer, forming the resultant mixture into a sheet, coating the sheet with a plurality of barrier layers to protect the surface of the sheet from external moisture and increase the lifespan of the sheet. However, since the sheet must be repeatedly coated with the barrier layers, the method has high manufacturing costs. Above all else, the ability to entirely protect QDs from the outside is limited.

Another conventional method includes: etching the surface of glass to a preset depth, introducing QDs to the etched portions of the glass, covering the etched portions with a glass cover sheet, applying low melting point glass to the peripheral portions of the glass cover sheet, sintering the low melting point glass, and forming a seal from the low melting point glass using a laser. However, the process of etching the glass surface increases manufacturing costs. In particular, thin film glass is difficult to use.

PRIOR ART DOCUMENT

Korea Patent Application Publication No. 10-2012-0050286 (May 18, 2012)

DISCLOSURE

Technical Problem

Accordingly, the present disclosure has been made in consideration of the above problems occurring in the prior art, and the present disclosure proposes a color-converting substrate for a light-emitting diode (LED), the color-converting substrate being able to be hermetically sealed to entirely protect quantum dots (QDs) accommodated therein from the outside, and a method of producing the same.

Technical Solution

According to an aspect of the present disclosure, a color-converting substrate for a light-emitting diode (LED) may include: a first substrate and a second substrate disposed on the light-emitting diode to face each other; a sheet disposed between the first substrate and the second substrate, the sheet having a hole formed therein; QDs contained in the hole; and a sealing material disposed along peripheral portions of the hole between the first substrate and a bottom surface of the sheet and between the second substrate and a top surface of the sheet, wherein the sheet is formed from a material allowing laser sealing to be performed between the sealing material, the first substrate, and the second substrate.

The sheet may be an aluminum foil having an anodized surface.

In addition, the sheet may be a 42-nickel (Ni) alloy sheet.

The sealing material may be frit glass.

Furthermore, the light-emitting diode may be a blue light-emitting diode, the QDs converting a wavelength of a portion of light emitted by the blue light-emitting diode into yellow light.

According to an aspect of the present disclosure, a method of producing a color-converting substrate for a light-emitting diode may include: preparing a sheet having a hole formed in a surface thereof; applying a first sealing material to a substrate to allow the hole to be edged by the first sealing material; aligning the sheet on the first sealing material such that the hole is placed in a region edged by the first sealing material; filling the hole with QDs; applying a second sealing material to the second substrate such that the hole filled with the QDs is edged by the second sealing material; and disposing the second substrate on the sheet to allow the hole to be edged by the second sealing material and performing laser sealing by irradiating with laser beams.

The step of preparing the sheet may include: forming the hole in the sheet by machining the sheet formed of an aluminum foil; and forming an aluminum thin film on a surface of the sheet by anodizing the sheet.

In addition, the step of preparing the sheet may form the hole in the sheet by machining the sheet formed from a 42-nickel alloy.

In the step of applying the first sealing material and the step of applying the second sealing material, frit glass having a paste form may be used as the first sealing material and the second sealing material.

Furthermore, the method may further include, after the step of forming the plurality of holes in the sheet and the step of performing the laser sealing for the plurality of holes, cutting the color-converting substrate into a plurality of cells, each cell defined by the first sealing material and the second sealing material Advantageous Effects As set forth above, a color-converting substrate for an LED can be produced by forming a hole by machining a sheet formed from a material allowing laser sealing to be performed between a sealing material and upper and lower substrates, filling the hole with QDs, applying a sealing material along the periphery of the hole, and then performing laser sealing on the sealing material and the upper and lower substrates. The resultant color-converting substrate for an LED can be hermetically sealed, thereby entirely protecting the QDs in the color-converting substrate from the outside.

In addition, an existing multilayer coating process or etching process can be omitted, thereby reducing manufacturing costs and overcoming the limitation to the thickness of a substrate.

DESCRIPTION OF DRAWINGS

FIG. 6 to FIG. 8 are views sequentially illustrating the method of producing a color-converting substrate for an LED according to the embodiment of the present disclosure.

MODE FOR INVENTION

Hereinafter, a color-converting substrate for a light-emitting diode (LED) and a method of producing the same according to embodiments of the present disclosure will be described in detail with reference to the following drawings.

In the following description, detailed descriptions of well-known functions or components will be omitted in the case that the subject matter of the present disclosure is rendered unclear by the inclusion thereof.

Figure 1:
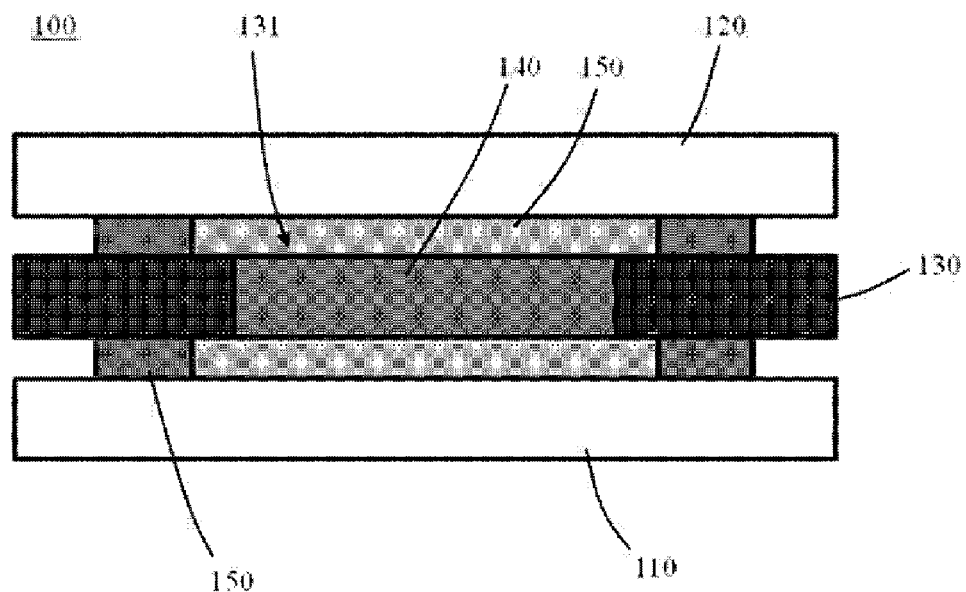
FIG. 1 is a cross-sectional view illustrating a color-converting substrate for an LED according to an embodiment of the present disclosure.
Figure 2:
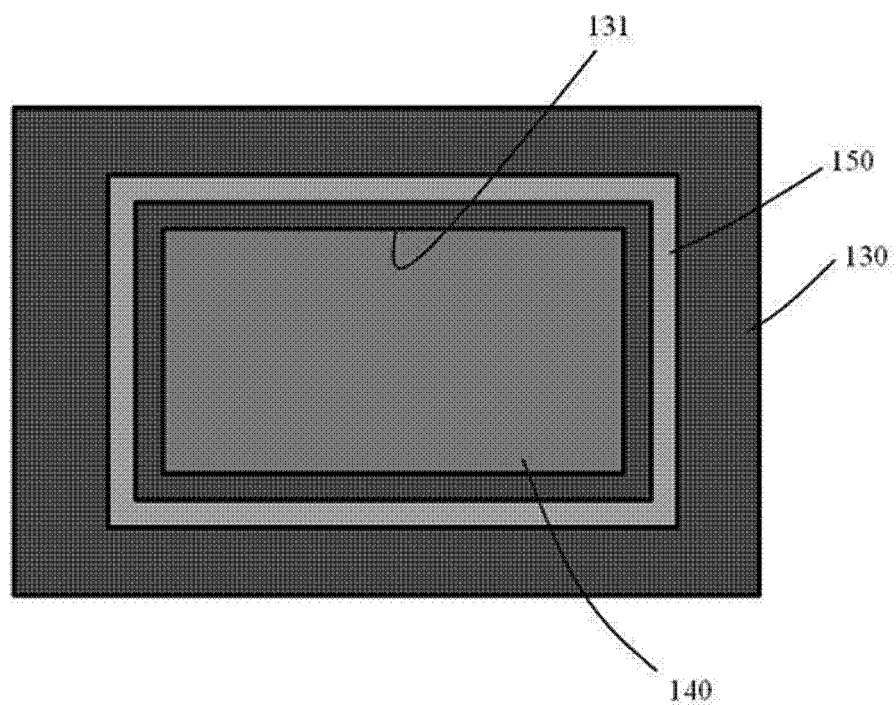
FIG. 2 is a plan view illustrating the color-converting substrate for an LED according to the embodiment of the present disclosure.

As illustrated in FIG. 1 and FIG. 2, a color-converting substrate 100 for an LED according to an embodiment of the present disclosure is a substrate disposed on an LED to seal the LED and converts the color of a portion of light generated by the LED. Thus, an LED package including the color-converting substrate 100 and the LED emits white light produced by allowing, for example, blue light emitted by a blue LED to be mixed with light, the color of which is converted by the color-converting substrate 100. Although not shown, the LED may include a body and an LED chip. In this case, the body may be a structure defining therein an open area having a predetermined shape. The structure of the body provides a structural space in which the LED chip is accommodated. The body may be provided with wires and a lead frame electrically connecting the LED chip to an external power source. In addition, the LED chip is a light source mounted on the body to generate light using a current applied from the external power source. The LED chip is formed as a forward junction of an n-type semiconductor layer providing electrons and a p-type semiconductor layer providing holes.

The color-converting substrate 100 according to the embodiment disposed on the LED includes a first substrate 110, a second substrate 120, a sheet 130, quantum dots (QDs) 140, and a sealing material 150.

The first substrate 110 and the second substrate 120 are sequentially disposed on the LED to face each other. That is, the first substrate 110 and the second substrate 120 are spaced apart from each other by the sheet 130, the QDs 140, and the sealing material 150 to face each other. The first substrate 110 and the second substrate 120 protect the sheet 130, the QDs 140, and the sealing material 150 and function as paths through which light emitted by the LED exits outwards. In this regard, the first substrate 110 and the second substrate 120 may be formed from transparent glass. For example, the first substrate 110 and the second substrate 120 may be formed from borosilicate glass or soda lime glass.

The sheet 130 is disposed between the first substrate 110 and the second substrate 120. The sheet 130 is a structure for accommodating the QDs 140. In this regard, a hole 131 is formed in the sheet 130. In an embodiment of the present disclosure, the sheet 130 is formed from a material allowing laser sealing to be performed between the sealing material 150, the first substrate 110, and the second substrate 120 such that the color-converting substrate 100 can be hermetically sealed. For example, the sheet 130 may be an aluminum foil having an anodized surface. The coefficient of thermal expansion (CTE) of aluminum (Al) is higher than either the CTE of the first substrate 110 and the second substrate 120 formed from glass or the CTE of the sealing material 150 formed from frit glass. When the aluminum foil is used, a mismatch is formed on the bonding surface due to the CTE difference at the time of bonding, thereby making hermetic sealing impossible. Thus, in an embodiment of the present disclosure, the anodized aluminum foil having an alumina ($Al_2O_3$) thin film formed on the surface thereof through anodizing may be used as a structure for accommodating the QDs 140, since the CTE the aluminum foil is similar to the CTEs of the first substrate 110, the second substrate 120, and the sealing material 150. At this time, when the anodized aluminum foil is used as the sheet 130, the first substrate 110 and the second substrate 120 may be formed from soda lime glass. In addition, in an embodiment of the present disclosure, the sheet 130 may be formed from a metal alloy, the CTE of which is similar to the CTEs of the first substrate 110, the second substrate 120, and the sealing material 150, such as a 42-nickel (Ni) alloy. In this case, the first substrate 110 and the second substrate 120 may be formed from borosilicate glass.

The QDs 140 are contained in the hole 131 formed in the sheet 130. At this time, the QDs 140 can be be hermetically sealed by the first substrate 110, the second substrate 120, and the sealing material 150 that are laser-sealed to be entirely protected from the outside. The QDs 140 are nanocrystals of a semiconductor material, the diameter of which ranges from about 1 μm to about 10 μm, and exhibit a quantum confinement effect. The QDs 140 generate wavelength-converted light, i.e. fluorescent light, by converting the wavelength of light emitted by the LED. In an embodiment of the present disclosure, since a blue LED is used as the LED, the QDs 140 may be formed from a QD material that converts the wavelength of a portion of light emitted by the blue LED to yellow light to produce white light through color mixing with blue light.

The sealing material 150 is disposed between the first substrate 110 and the bottom surface of the sheet 130 and between the second substrate 120 and the top surface of the sheet 130. The sealing material 150 is disposed along the periphery of the hole 131 formed in the sheet 130. Thus, when the sealing material 150, the first substrate 110, and the second substrate 120 are laser-sealed, the QDs 140 contained in the hole 131 can be hermetically sealed by the first substrate 110, the second substrate 120, and the sealing material 150 to be entirely protected from the outside. In an embodiment of the present disclosure, the sealing material 150 may be formed from frit glass to be laser-sealed with the first substrate 110 and the second substrate 120 formed from glass.

Hereinafter, a color-converting substrate for an LED according to another embodiment of the present disclosure will be described with reference to FIG. 3 and FIG. 4.

Figure 3:
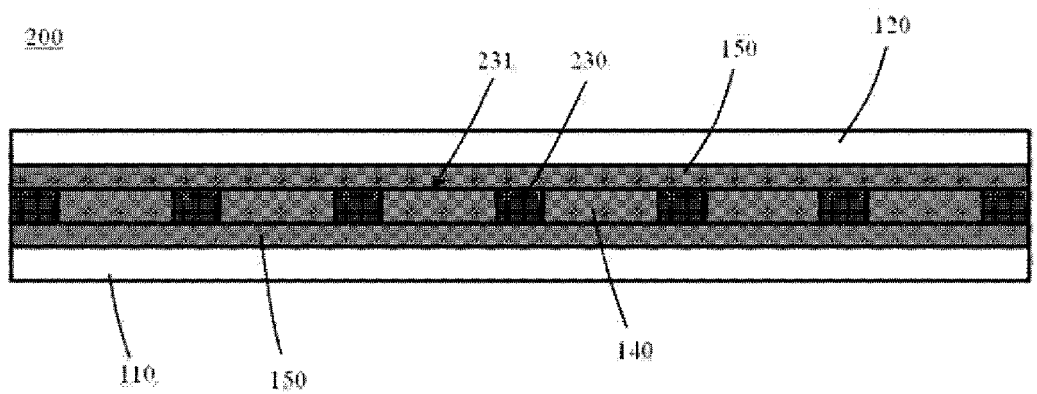
FIG. 3 is a cross-sectional view illustrating a color-converting substrate for an LED according to another embodiment of the present disclosure.
Figure 4:
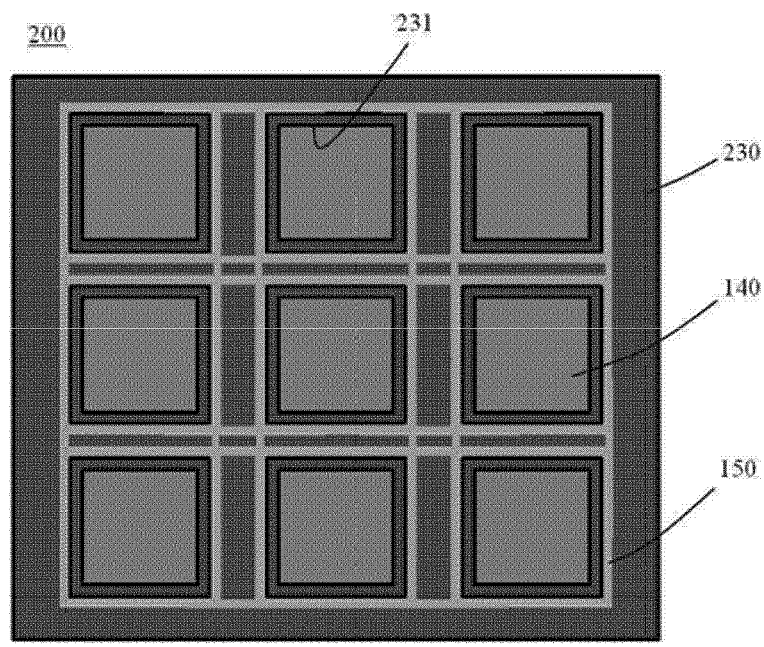
FIG. 4 is a plan view illustrating the color-converting substrate for an LED according to another embodiment of the present disclosure.
Figure 5:
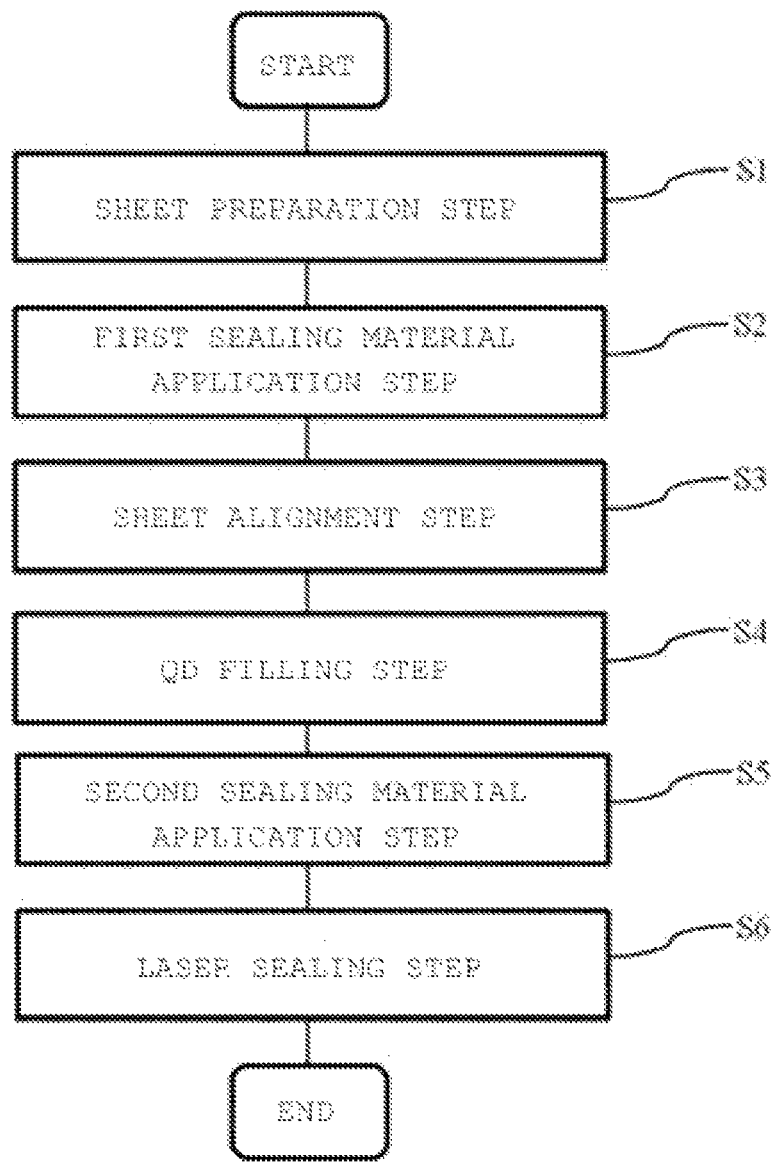
FIG. 5 is a process flowchart illustrating a method of producing a color-converting substrate for an LED according to an embodiment of the present disclosure.

FIG. 3 is a cross-sectional view illustrating a color-converting substrate for an LED according to another embodiment of the present disclosure, and FIG. 4 is a plan view illustrating the color-converting substrate for an LED according to another embodiment of the present disclosure.

As illustrated in FIG. 3 and FIG. 4, a color-converting substrate 200 for an LED according to another embodiment of the present disclosure includes a first substrate 110, a second substrate 120, a sheet 230, QDs 140, and a sealing material 150.

The color-converting substrate 200 according to the present embodiment is substantially the same as the color-converting substrate 100 according to the former embodiment, except that a plurality of holes are formed in a single sheet. Thus, the same reference numerals will be used to designate the same components and detailed descriptions thereof will be omitted.

The color-converting substrate 200 for an LED according to another embodiment of the present disclosure is, for example, a substrate used for a plurality of LEDs acting as a backlight source of a large screen LCD. In this regard, a plurality of holes 231 are formed in the sheet 230 in accordance with the arrangement of the plurality of LEDs. Each of the plurality of holes 231 is filled with the QDs 140. The sealing material 150 is disposed along the periphery of each of the plurality of holes 231 between the sheet 230 and the top surface of the first substrate 110 and between the sheet 230 and the bottom surface of the second substrate 120. At this time, the sheet 230 may be formed from the same material as the sheet 130 according to the former embodiment of the present disclosure.

As described above, in the color-converting substrates 100 and 200 for an LED according to embodiments of the present disclosure, since the sheets 130 and 230 accommodating the QDs 140 are formed from a material allowing laser sealing to be performed between the first substrate 110, the second substrate 120, and the sealing material 150, the QDs 140 can be hermetically sealed, such that the QDs 140 contained in the holes 131 and 231 of the sheets 130 and 230 can be entirely protected from the outside. This can consequently increase the lifespan of an LED package including the color-converting substrates 100 and 200.

Hereinafter, a method of producing a color-converting substrate for an LED according to an embodiment of the present disclosure will be described with reference to FIG. 5 to FIG. 8.

As illustrated in FIG. 8, the method of producing the color-converting substrate for an LED according to the embodiment of the present disclosure includes a sheet preparation step S1, a first sealing material application step S2, a sheet alignment step S3, a QD filling step S4, a second sealing material application step S5, and a laser sealing step S6. Here, the method of producing the color-converting substrate for an LED according to the embodiment of the present disclosure will be described by exemplifying a method of producing a color-converting substrate for an LED used as a backlight source of a large screen LCD.

Figure 6:
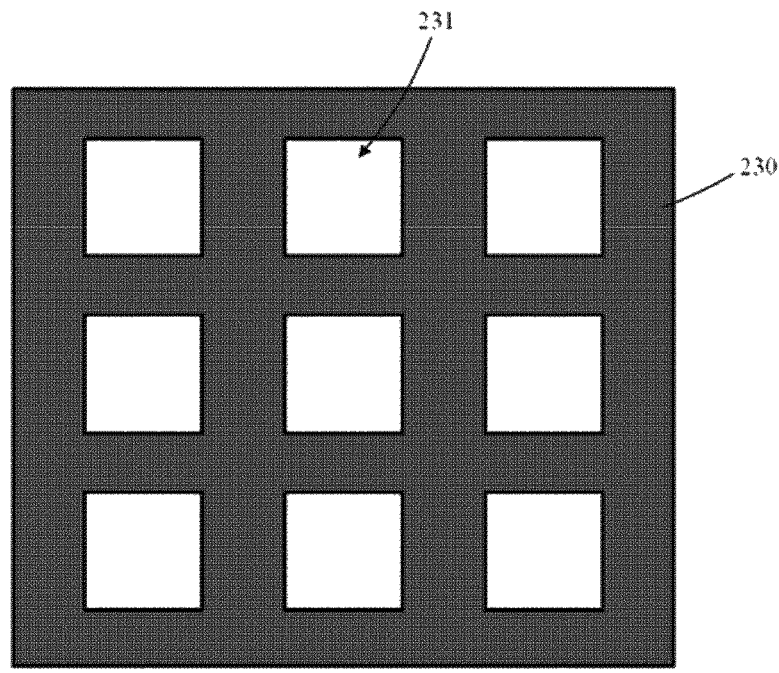

First, as illustrated in FIG. 6, the sheet preparation step S1 is a step of preparing a sheet 230 having a plurality of holes 231 formed in the surface thereof. For example, in the sheet preparation step S1, the plurality of holes 231 are formed in the sheet 230 by machining the sheet 230 formed of an aluminum foil, and then an alumina ($Al_2O_3$) thin film is formed on the surface of the sheet 230 by anodizing the sheet 230. As an alternative, in the sheet preparation step S1, the plurality of holes 231 may be formed in the sheet 230 by machining the sheet 230 formed from a 42-Ni alloy. At this time, in the sheet preparation step S1, for mass production, several sheets 230 formed from the 42-Ni alloy may be stacked on one another, and then the plurality of holes 231 may be formed through punching. Furthermore, in the sheet preparation step S1, the surface of the sheet 230 formed from the 42-Ni alloy may be sandblasted or etched using a solvent, such as an acid, to have surface roughness, so that the bonding force between the sheet 230 and a sealing material (150 in FIG. 8) applied in a subsequent process can be increased.

The next first sealing material application step S2 is a step of applying the sealing material (150 in FIG. 8) on a first substrate (110 in FIG. 3) such that each of the plurality of holes 231 is edged by the sealing material. In the first sealing material application step S2, the sealing material (150 of FIG. 8) formed from frit glass and having a paste form is applied such that the holes 231 located above the first substrate (110 in FIG. 3) formed from glass are divided from each other.

The subsequent sheet alignment step S3 is a step of aligning the sheet 230 on the sealing material (150 in FIG. 8). In the sheet alignment step S3, the sheet 230 is aligned on the sealing material (150 in FIG. 8) such that the plurality of holes 231 are placed in a plurality of regions edged by the sealing material (150 in FIG. 8). In the sheet alignment step S3, the sealing material (150 in FIG. 8) applied between the sheet 230 and the first substrate (110 in FIG. 3) is sintered.

Figure 7:
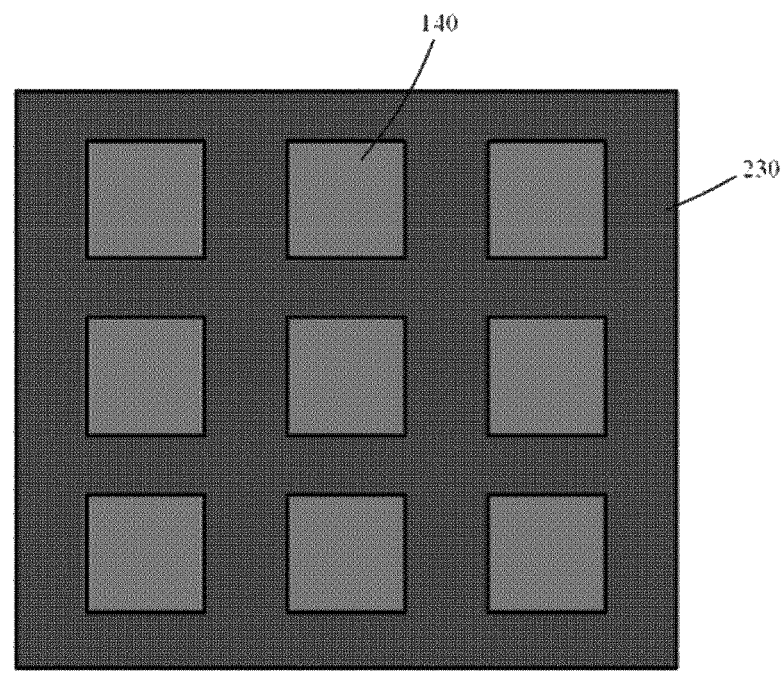

As illustrated in FIG. 7, the subsequent QD filling step S4 is a step of filling the holes 231 of the sheet 230 with QDs 140. In the QD filling step S4, each of the plurality of holes 231 is filled with a QD material converting the wavelength of a portion of light emitted by a blue LED into yellow light.

As illustrated in FIG. 8, in the following second sealing material application step S5, a second sealing material 150 is applied on a second substrate (120 in FIG. 3) such that the holes 231 filled with the QDs 140 can be edged by the second sealing material 150. In the second sealing material application step S5, the second sealing material 150 is applied to the second substrate (120 of FIG. 3) formed from glass such that the holes 231 can be edged by the second sealing material 150. In the second sealing material application step S5, the second sealing material 150 formed from frit glass has the same paste form as the first sealing material 150.

Finally, the laser sealing step S6 is a step of sealing the first substrate (110 in FIG. 3), the first sealing material 150, the second substrate (120 in FIG. 3), and the second sealing material 150 irradiating laser beams. In this regard, in the laser sealing step S6, the second substrate (120 in FIG. 3) is aligned on the sheet 230 such that the holes 231 are edged by the second sealing material 150, and then laser beams are irradiated.

When the laser sealing step S6 is completed as described above, the color-converting substrate 200 for an LED according to the embodiment of the present disclosure is manufactured. The color-converting substrate 200 manufactured according to the embodiment of the present disclosure is, for example, a substrate used for a plurality of LEDs acting as a backlight source of a large screen LCD. For the use as a single color-converting substrate for a single LED (i.e. the substrate 100 in FIG. 1), the substrate can be cut into cells, each cell defined by the first sealing material 150 and the second sealing material 150. Accordingly, each of the cells may be used as a single color-converting substrate for a single LED (i.e. the substrate 100 in FIG. 1). As described above, according to embodiments of the present disclosure, a plurality of color-converting substrates (100 in FIG. 1) may be easily produced using a single process.

When the color-converting substrates (100 in FIGS. 1 and 200) are manufactured using the above-described method, a conventional multilayer coating process for protecting QDs can be omitted, thereby reducing manufacturing costs. Since a conventional etching process for the accommodation of the QDs can be omitted, the limitation to the thickness of a substrate can be removed.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure not be limited to the foregoing embodiments, but be defined by the Claims appended hereto and their equivalents.

DESCRIPTION OF REFERENCE NUMERALS IN DRAWINGS

100, 200: color-converting substrate
110: first substrate
120: second substrate
130, 230: sheet
131, 231: hole
140: QD
150: sealing material

The invention claimed is:

1. A method of producing a color-converting substrate for a light-emitting diode, the method comprising:
preparing a sheet having a hole formed in a surface of the sheet, including forming the hole in the sheet by machining the sheet formed of an aluminum foil, and forming an aluminum thin film on the surface of the sheet by anodizing the sheet:
applying a first sealing material to a first substrate to allow the hole to be edged by the first sealing material;
aligning the sheet on the first sealing material such that the hole is placed in a region edged by the first sealing material;
filling the hole with quantum dots;
applying a second sealing material to a second substrate to allow the hole filled with the quantum dots to be edged by the second sealing material; and
disposing the second substrate on the sheet such that the hole is edged by the second sealing material and performing laser sealing by irradiating with laser beams.

2. The method of claim 1, wherein frit glass in a paste form is used as the first sealing material and the second sealing material.

3. The method of claim 1,
wherein the hole comprises a plurality of holes, and
the method further comprises, after forming the plurality of holes in the sheet and performing laser sealing for the plurality of holes, cutting the color-converting substrate into a plurality of cells, each cell defined by the first sealing material and the second sealing material.

* * * * *